United States Patent [19]
Johannessen

[11] Patent Number: 5,952,735
[45] Date of Patent: Sep. 14, 1999

[54] METHOD OF AND APPARATUS FOR OPTIMIZING THE MATCHING OF PULSE GENERATORS DRIVING HIGH "Q" TUNED LOADS, BY PHASE SPLITTING

[75] Inventor: Paul R. Johannessen, Lexington, Mass.

[73] Assignee: Megapulse, Inc., Bedford, Mass.

[21] Appl. No.: 09/031,020

[22] Filed: Feb. 26, 1998

[51] Int. Cl.⁶ .......................................................... H03K 3/00
[52] U.S. Cl. ............................ 307/106; 343/822; 343/852
[58] Field of Search ..................................... 307/106, 419, 307/73, 87, 129; 326/29, 30; 327/181, 291, 544; 379/394, 398; 333/124, 129, 17.3, 32; 340/310.05; 343/822, 852, 860

[56] References Cited

U.S. PATENT DOCUMENTS

| 4,001,598 | 1/1977 | Johannessen | 307/106 |
| 5,585,758 | 12/1996 | Prines et al. | 327/181 |

*Primary Examiner*—Richard T. Elms
*Attorney, Agent, or Firm*—Rines and Rines

[57] ABSTRACT

A technique for optimizing the impedance match between a plurality of pulse generators and a high-Q tuned load by equally advancing and retarding the phase of equal groups of pulse generator modules with respect to the load voltage. The sum output current is in phase with the coupling network voltage and produces alternating pulse generator sinewave outputs of successive plus and minus equal phase shifts with respect to the load voltage.

8 Claims, 6 Drawing Sheets

IMPEDANCE MATCHING BY "PHASE SPLITTING"

5,952,735

METHOD OF AND APPARATUS FOR OPTIMIZING THE MATCHING OF PULSE GENERATORS DRIVING HIGH "Q" TUNED LOADS, BY PHASE SPLITTING

The present invention relates to the driving of high "Q" tuned loads by pulse generators, being more particularly directed to tuned antenna loads and to the improvement and indeed optimization of the match between the generators and the loads.

BACKGROUND OF INVENTION

High-power pulse generators of the zero current switching type are used extensively to drive high 'Q' tuned loads. One of the important applications resides in the driving of high "Q" tuned antenna loads, such as in radio-frequency pulse transmitters as, for example, of the Loran-C navigation pulse type in my earlier U.S. Pat. Nos. 4,001,598; 3,832,573; and 3,889,263. These pulse generators use either magnetic switching, SCR (thyristor) switching, or a combination thereof, as the basic switching elements. In each application, however, there exists the problem of impedance matching between the pulse generators and the load that heretofore has not been optimized but has rather been comprised as the best that could be done. In this patent disclosure, however, a novel matching method and apparatus are described that admirably solve this problem by enabling optimization of the match.

OBJECTS OF INVENTION

The primary object of the invention, accordingly, is to provide a new and improved method of and apparatus for optimizing the matching of pulse generators driving high "Q" tuned loads, and doing so by phase splitting techniques.

Other and further objects are explained hereinafter and are more particularly delineated in the appended claims.

SUMMARY

In summary, however, the invention embraces a pulse-generating system wherein a plurality of parallely and alternate-polarity connected multi module pulse generators drive a high Q load through a common coupling network, and in which there is provided a method of optimizing the impedance match between all the modules of the pulse generators and the load, that comprises, dividing the pulse generator modules of each pulse generator into equal groups, advancing the phase of the output of one group of pulse generator modules of each pulse generator a predetermined phase angle shift with respect to the load voltage, and retarding the phase of the output of the other group of pulse generator modules the same predetermined phase angle shift so that the sum output current is in phase with the coupling network voltage, producing successive alternating pulse generator sinewave outputs of successive plus and minus equal phase shifts with respect to the load voltage.

Preferred and best mode designs and embodiments are hereinafter presented in detail.

DRAWINGS

The invention will now be described with reference to the accompanying drawings, FIG. 1 of which is a block diagram of a typical pulse generator-driven Loran-C transmitter operating into a high "Q" antenna load, and adapted for the use of the technique of the invention;

PREFERRED EMBODIMENT

Before describing the novel preferred phase-splitting technique and apparatus of the invention for achieving optimization of the impedance matching of the plurality of pulse generators driving a high "Q" tuned load, as in the illustrative Loran-C type transmitter application, it is believed necessary preliminarily to discuss that matching problem in such an application.

Figure 1:
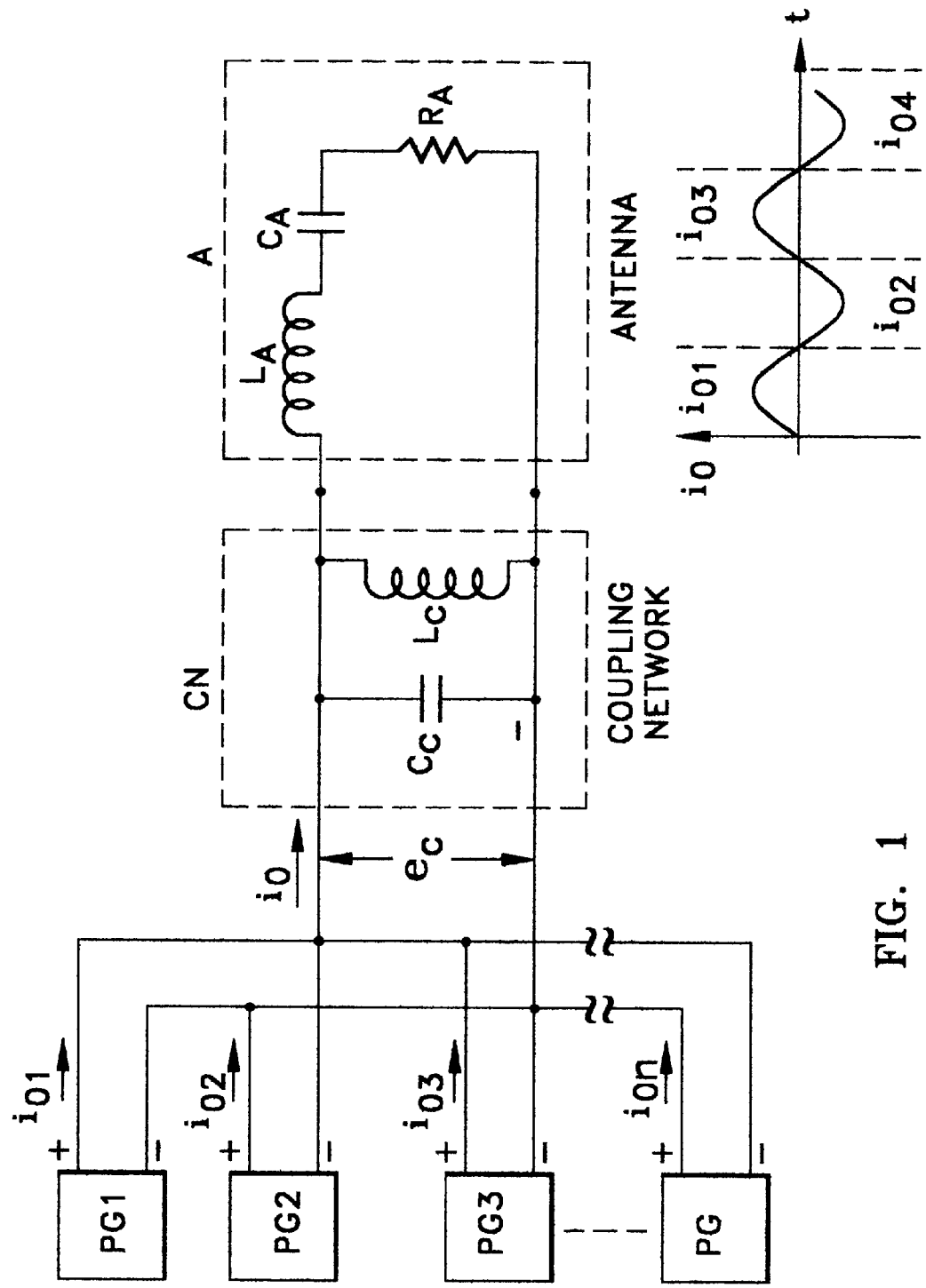
Figure 2:
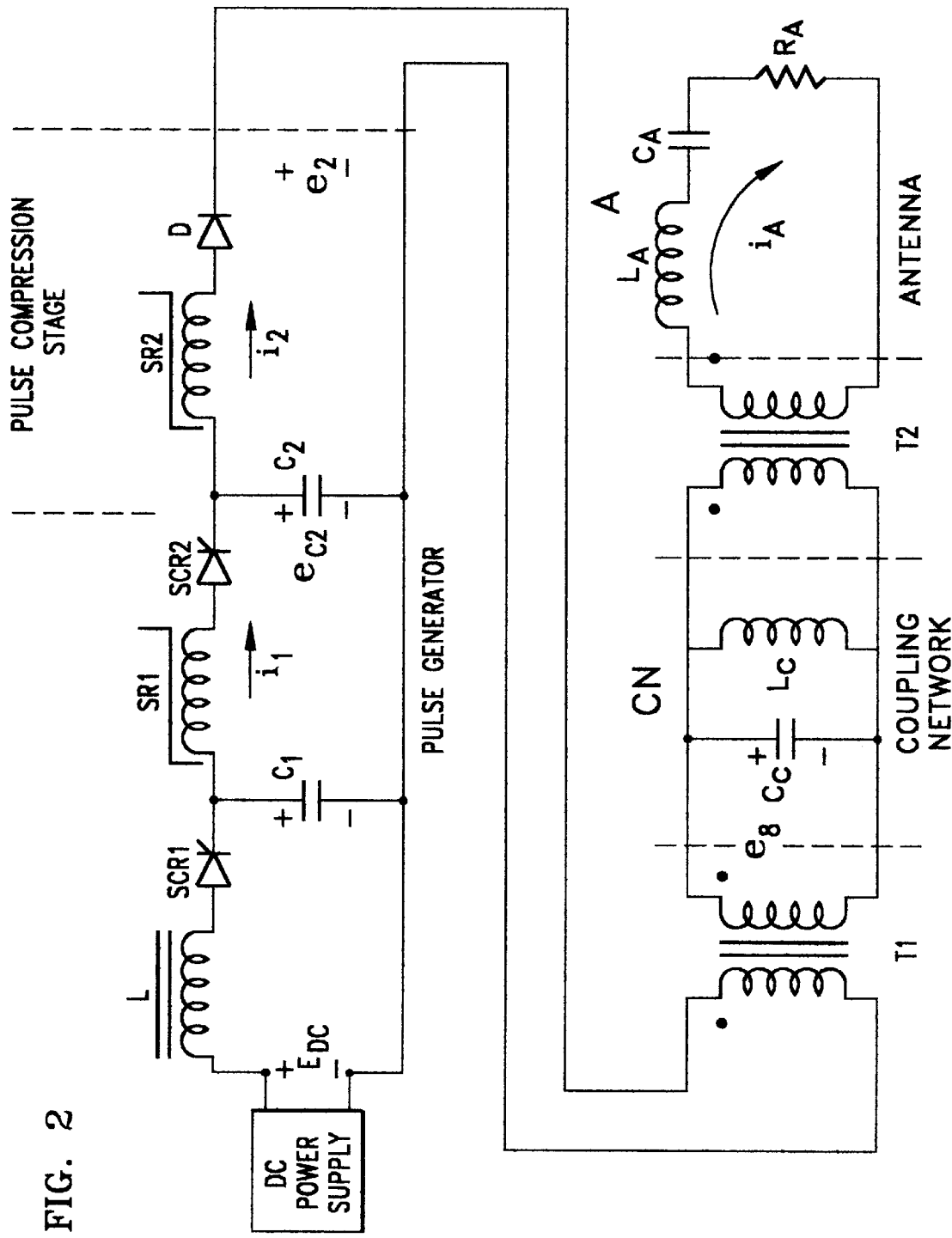
FIGS. 2 and 3 are respectively circuit diagrams of suitable known versions of pulse generator modules and load, with and without magnetic compression, respectively.

A simplified block diagram of a Loran-C transmitter is show in FIG. 1, consisting of 'n' number ('n' being even) of pulse generators, PG1, PG2, PG3 . . . PG$_n$ connected in parallel at their outputs with alternate polarity. For example, the +output of current $i_{O1}$ of the pulse generator PG1 is connected to the minus (-) side of the PG2 output $i_{O2}$, etc. These pulse generators are triggered sequentially, as is well-known and described in the above-mentioned patents, to generate an alternating current output shown at the bottom right of FIG. 1. Each pulse generator PG, (as later shown in FIG. 6, at PG$_m$ 1, 2, etc.) consists of an even number of pulse generator modules, so connected in parallel and triggered simultaneously. The pulse generators in turn are connected to a coupling network CN which is connected to the high "Q" tuned antenna common load A. To understand the previously referenced matching problem, the operation of the combined pulse generator and load will now be analyzed with reference to the illustrative circuit diagrams of pulse generator modules and load shown in FIGS. 2 and 3, respectively with and without magnetic compression.

Figure 3:
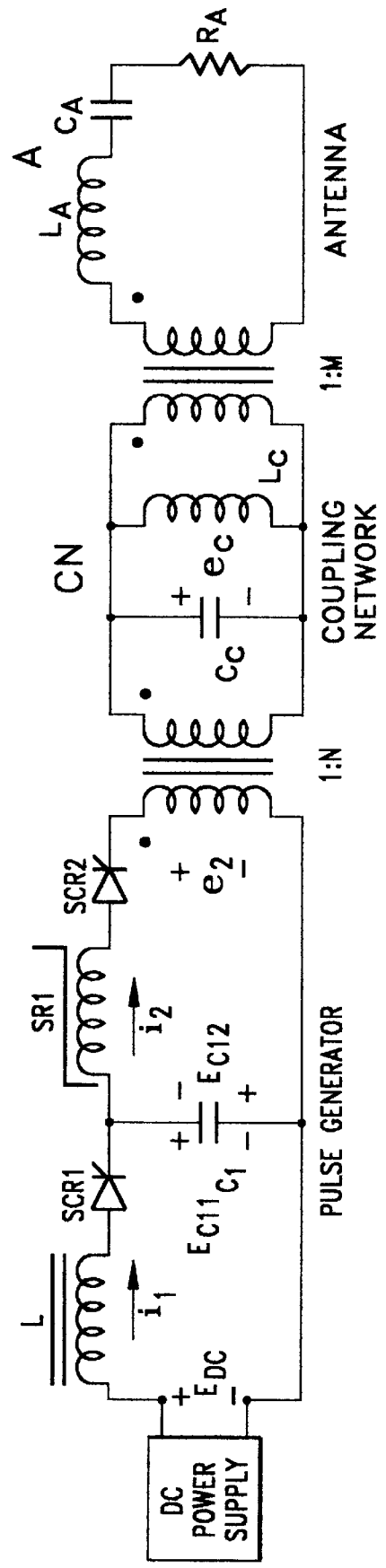
Figure 4:
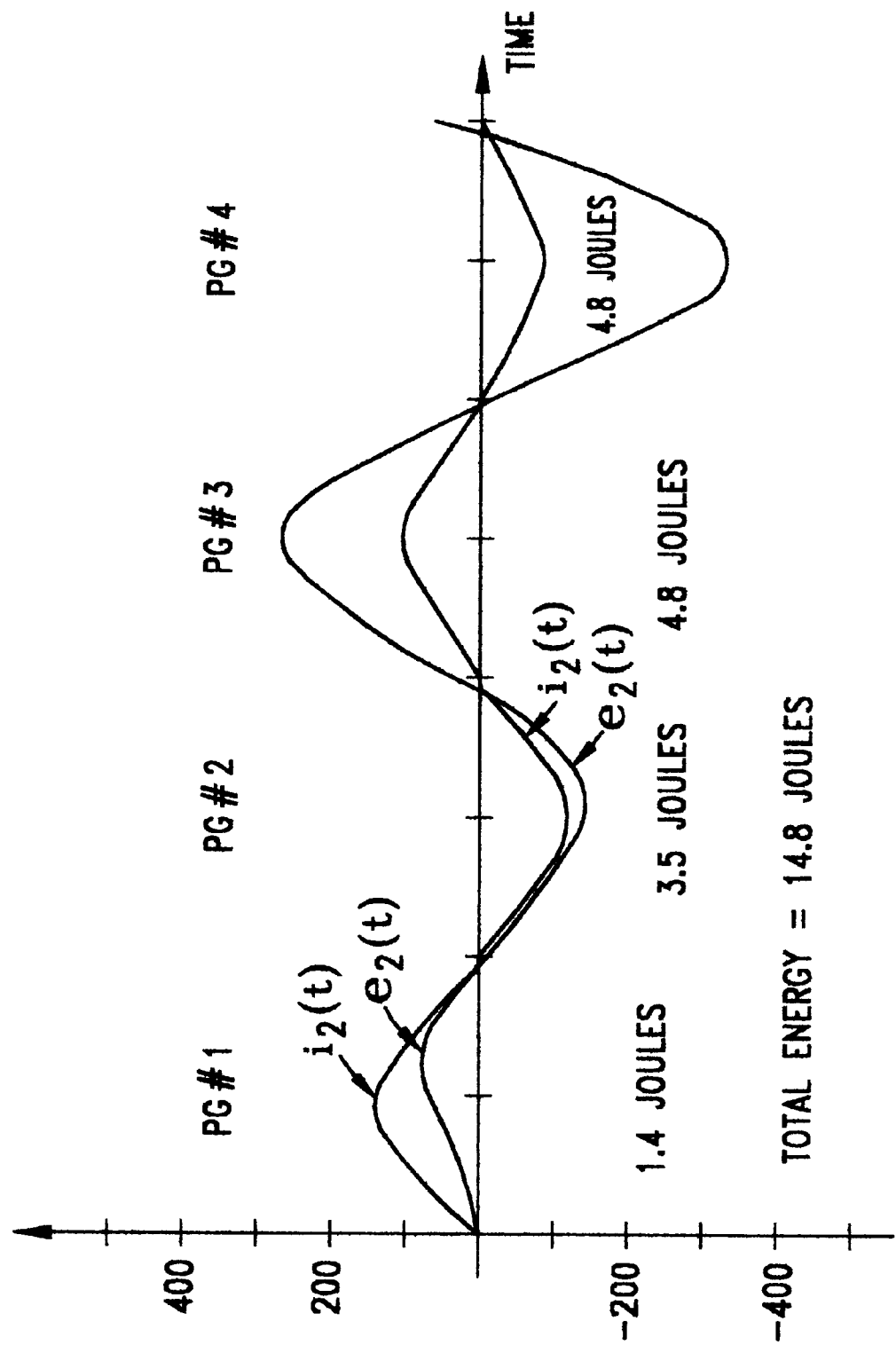
FIG. 4 is a voltage and current waveform graph illustrating the voltage and current waveforms produced during the leading edge of the Loran-C pulse-generating process by a plurality of pulse generators.

During the leading edge of a Loran-C RF pulse, the voltage and current waveforms at the output of the pulse generators ($i_2$ and $e_2$ in FIGS. 2 and 3) are of the form shown in FIG. 4. In this example, pulse generator PG #1 on the first half cycle delivers only 1.4 joules of energy for the load A; while pulse generators #2, #3 and #4 deliver, respectively, 3.5, 4.8 and 4.8 joules. This clearly shows a serious matching problem. Properly matched, the pulse generators should be able to generate maximum output power regardless of in which half cycle it operates. For simplicity of explanation, the mechanism of the pulse generation will now be discussed in connection with the generator of FIG. 3, though the analysis applies equally to the pulse generator of FIG. 2.

Figure 5:
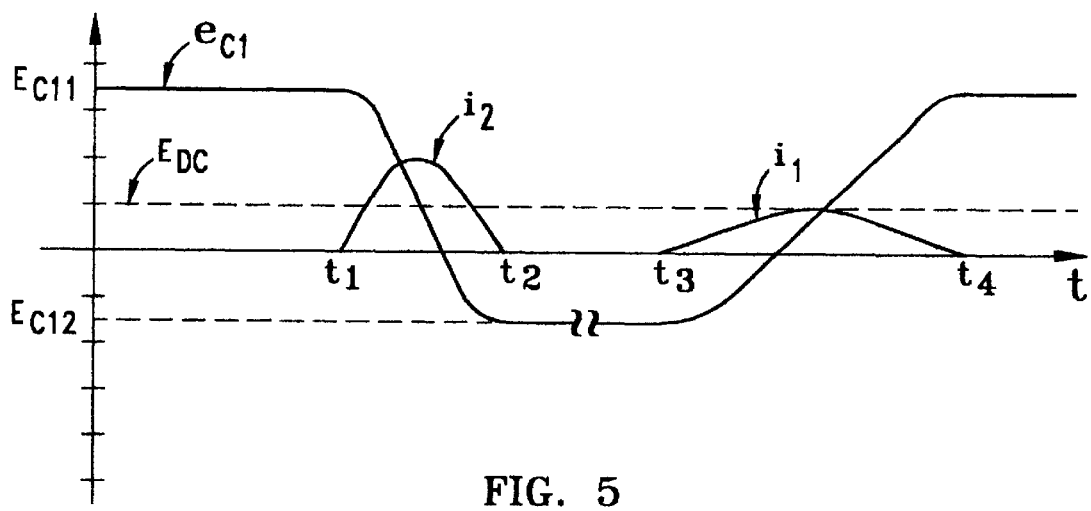
FIG. 5 illustrates typical voltage and current waveforms of the pulse generators.

The voltage and current waveforms of the pulse generators are shown in FIG. 5. Initially, the capacitor $C_1$ is charged to the value $E_{c11}$. At time SCR1 of FIG. 3 is turned on, the energy stored on $C_1$ is partly discharged into the load, and partly restored on $C_1$, but with reversed voltage polarity $E_{c12}$, as shown in FIG. 5. The energy discharged into the load is given by the equation:

This energy is a maximum when $E_{c12}$ is equal to zero. When using conventional switching devices such as ordinary semiconductor SCR's and saturable reactors, this optimum cannot be satisfied because a reverse voltage must be applied to the switching device immediately after the switching process to sweep out the minority carriers in the semiconductor junction, thus restoring the device to a non-conducting state, as disclosed in my earlier U.S. Pat. No. 4,230,955. With modern-day MOS-controlled thyristors (SCR's), however, very fast recovery is now achievable, making it possible to achieve the optimum conditions underlying the invention.

In the first half cycle, the voltage $e_2$ is proportional to the impedance of the coupling network because the output impedance of the pulse generator is much larger than the impedance of the coupling network. By increasing the coupling network impedance by a factor of four, for example, an approximate increase of 3.8 may be obtained in the output voltage, and a decrease of 0.8 in the output current. The resultant increase in output power is a factor of 3. However, by increasing the coupling network impedance, the pulse generators in half cycles 2, 3 and 4 (or higher) are mismatched and, therefore, will not deliver the maximum energy to the load. Capacitor $C_1$ will thus only be partially discharged and no reverse voltage will be applied to the switching device (SCR). The SCR will accordingly not recover, resulting in faulty operation. Presently, only pulse generators in half cycles 3 and 4 are matched, and the resulting mismatch that occurs in half cycles 1 and 2 is just usually accepted as unavoidable for operation.

The present invention admirably solves this problem and enables optimization of matching, as will now be explained with reference to FIG. 6

Figure 6:
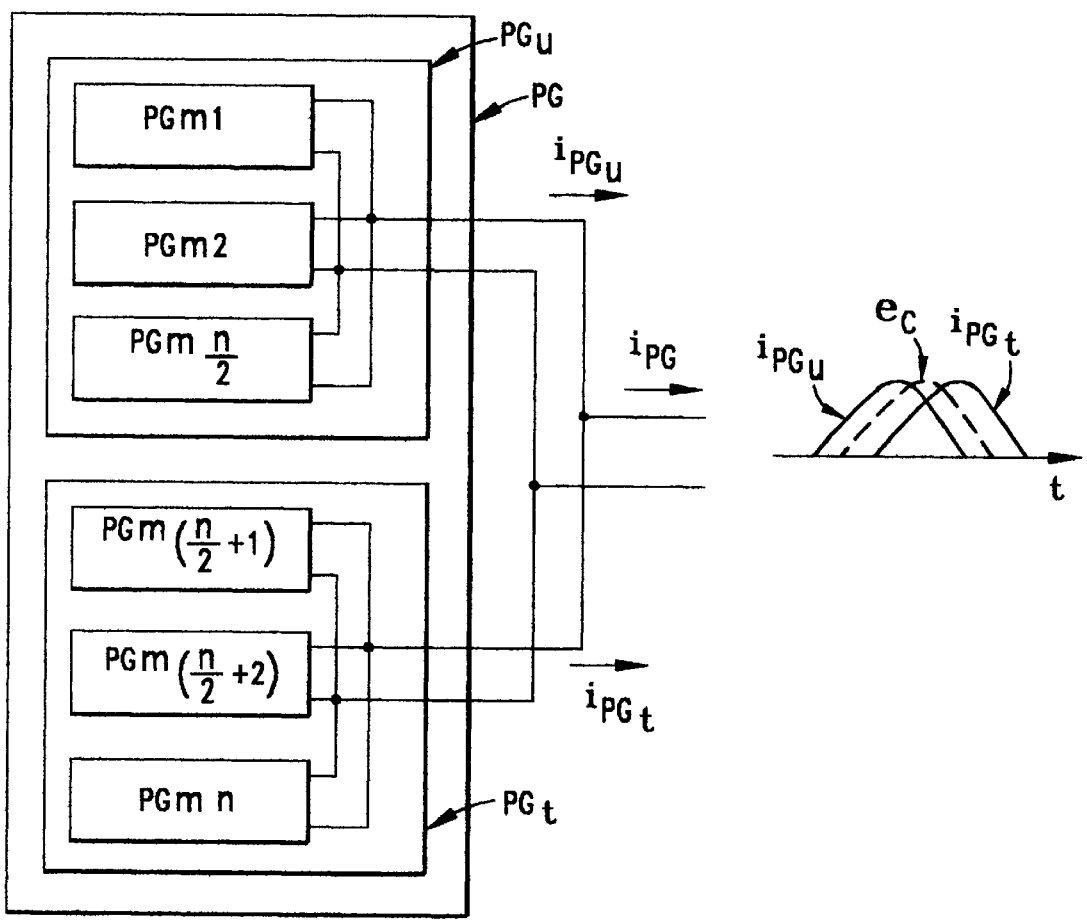
FIGS. 6 and 7 are, respectively, a block diagram incorporating the implementation of impedance matching by the novel phase splitting technique of the invention and a graph of the waveform operation thereof.

Each pulse generator PG consists of an even number of multi-module $PG_m$'s connected in parallel, as shown in FIG. 6. These modules are divided into two groups: $PG_u$ and $PG_e$, each containing one-half number of modules in the PG.

Figure 7:
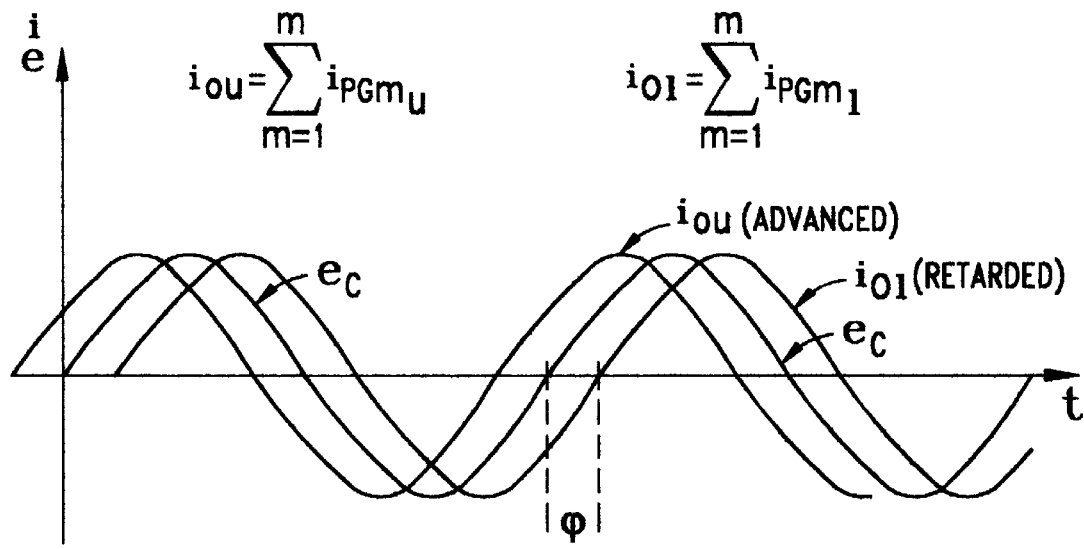

Further in accordance with the invention, the output of one group is advanced in time, while the output of the other group is retarded in time by the same amount, so that the sum current is in phase with the coupling network voltage $e_c$ as shown in FIG. 7. This process is herein referred to as 'phase splitting'.

Thus, the output of the PG's of FIG. 1 is two sinewaves with plus and minus equal phase shifts with respect to the load voltage $e_e$, as more specifically shown in FIG. 7, where $i_{ou}$ is shown adjusted to be advanced an angle $\phi$ from the reference phase of $e_c$, and $i_{o1}$ is shown retarded an angle $-\phi$. For optimum performance, all pulse generator modules should operate with the same $E_{c11}$ and the same $E_{c12}$ such that all pulse generator modules deliver the same amount of energy to the load A, and the output module current $i_2$ is the same for all modules. This optimum matching condition is obtained by selecting:

$$\varphi = \arccos \frac{2}{\pi} \frac{E_{c11} - E_{c12}}{E_2}$$

Figure 8:
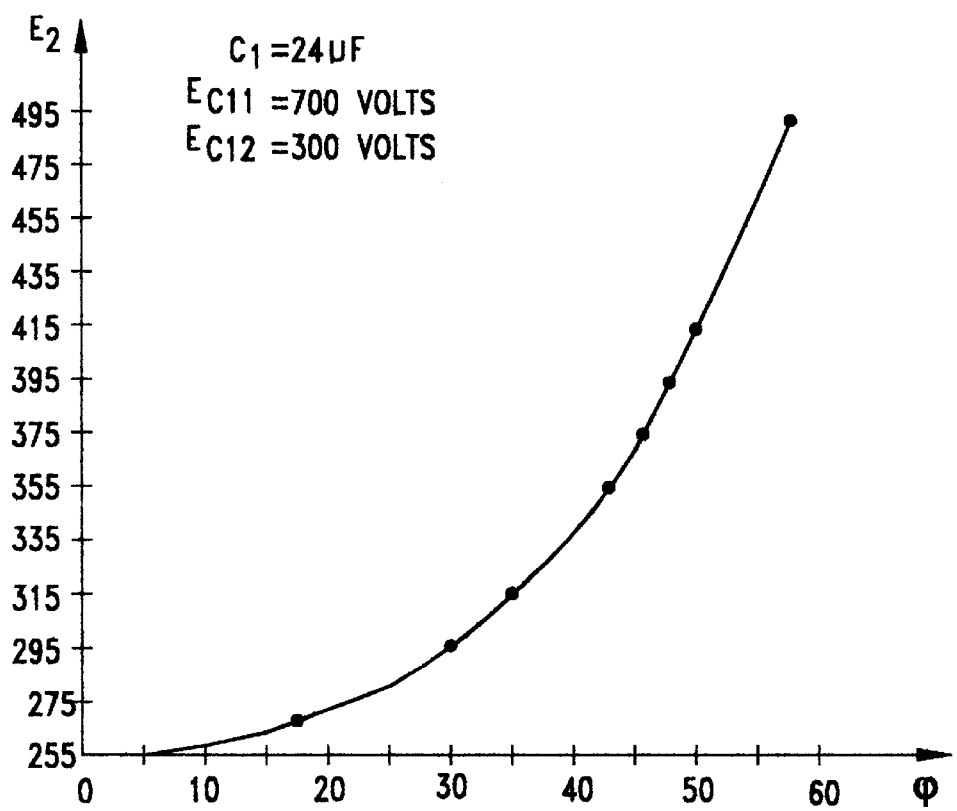
FIG. 8 is a graph of phase splitting in degrees as a function of output voltage for an illustrative set of capacitor and voltages operated in the phase splitting mode of the invention.

A exemplary plot of $E_2$ vs. $\phi$ for the following illustration numerical values:

$C_1 = 24\ \mu F$ $E_{c11} = 700$ volts $E_{c12} = 300$ volts, is shown in FIG. 8.

Modifications will occur to those skilled in this art and such are considered to fall within the spirit and scope of the invention as defined in the appended claims.

What is claimed is:

1. In a pulse-generating system wherein a plurality of parallely and alternate-polarity connected multi-module pulse generators drive a high Q load, through a common coupling network, a method of optimizing the impedance match between all the modules of the pulse generators and the load, that comprises, dividing the pulse generator modules of each pulse generator into equal groups, advancing the phase of the output of one group of pulse generation modules of each pulse generator a predetermined phase angle shift with respect to the load voltage, and retarding the phase of the output of the other group of pulse generator modules the same predetermined phase angle shift so that the sum output current is in phase with the coupling network voltage, producing successive alternating pulse generator sinewave outputs of successive plus and minus equal phase shifts with respect to the load voltage.

2. A method as claimed in claim 1 wherein the high Q load is an antenna.

3. A method of optimizing the impedance match between a plurality of pulse generators each comprised of an even number of parallely and alternate-polarity connected pulse generation modules for driving a common high Q load, that comprises, advancing the phase of the output of half of the pulse generation modules a predetermined angle while retarding the phase of the output of the other half of the modules the same angle with respect to the load voltage.

4. A method as claimed in claim 3 wherein each pulse generation module is adjusted to deliver the same amount of energy to the load.

5. A pulse-generating apparatus having, in combination, a plurality of parallely and alternate-polarity connected multi-module pulse generators connected to drive a common high Q load, means for phase shifting half the modules of each pulse generator a predetermined positive phase angle and for phase shifting the other half the same predetermined phase angle, but negative, with respect to the load voltage.

6. Apparatus as claimed in claim 5 wherein the load is a high-Q antenna connected to the pulse generators through a common coupling network.

7. Apparatus as claimed in claim 6 wherein the sum output current of the pulse generators is in phase with the coupling network voltage.

8. Apparatus as claimed in claim 7 wherein each pulse generator is provided with a pair of triggerable SCR switches and saturable reactor means sharing a common capacitor for storing energy to a voltage value $E_{c11}$ and at least partially discharging such into the load to a voltage $E_{c12}$ to produce a load voltage $E_2$, and wherein the angle $\phi$ of the predetermined phase shifts is given substantially by $$\varphi = \arccos \frac{2}{\pi} \frac{E_{c11} - E_{c12}}{E_2}.$$

\* \* \* \* \*

UNITED STATES PATENT AND TRADEMARK OFFICE
CERTIFICATE OF CORRECTION

PATENT NO. : 5,952,735            Page 1 of 1
DATED : September 14, 1999
INVENTOR(S) : Paul R. Johannessen It is certified that error appears in the above-identified patent and that said Letters Patent is hereby corrected as shown below:

Column 3,
Lines 4 and 5, please delete the sentence reading: "The energy discharged into the load is given by the equation:"; erroneously maintained in the application.
Line 42, please correct "$PG_e$" to read: "$PG_t$,", in order to conform to the showing in Fig. 6.

Signed and Sealed this

Fourteenth Day of August, 2001

*Attest:*

NICHOLAS P. GODICI
*Attesting Officer*     *Acting Director of the United States Patent and Trademark Office*